United States Patent
Feng et al.

(10) Patent No.: US 9,449,139 B2
(45) Date of Patent: Sep. 20, 2016

(54) SYSTEM AND METHOD FOR TRACING A NET

(71) Applicant: TAIWAN SEMICONDUCTOR MANUFACTURING COMPANY, LTD., Hsinchu (TW)

(72) Inventors: Ming Feng, Shanghai (CN); Li Huang, Shanghai (CN); Zhen-Yi Chen, Shanghai (CN); Ya-Min Zhang, Shanghai (CN); Mu-Jen Huang, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/609,996

(22) Filed: Jan. 30, 2015

(65) Prior Publication Data

US 2016/0004808 A1  Jan. 7, 2016

(30) Foreign Application Priority Data

Jul. 3, 2014 (CN) .......................... 2014 1 0314963

(51) Int. Cl.
*G06F 9/455*    (2006.01)
*G06F 17/50*    (2006.01)

(52) U.S. Cl.
CPC ....... *G06F 17/5081* (2013.01); *G06F 17/5077* (2013.01)

(58) Field of Classification Search
CPC ........... G06F 17/5081; G06F 17/5077; G06F 17/5068; G06F 17/5072; G06F 21/14; G06F 2203/04806; G06F 2217/06; G06F 2217/74; G06F 3/0481; G06F 3/04812
See application file for complete search history.

(56) References Cited

U.S. PATENT DOCUMENTS

| | | | | |
|---|---|---|---|---|
| 5,903,469 | A * | 5/1999 | Ho | G06F 17/5081 716/115 |
| 8,438,530 | B2 * | 5/2013 | Giffel | G06F 17/5077 716/139 |
| 8,601,416 | B2 | 12/2013 | Kuo et al. | |
| 8,707,231 | B2 * | 4/2014 | Reber | G06F 17/5081 378/35 |
| 8,762,900 | B2 | 6/2014 | Shin et al. | |
| 8,762,912 | B2 * | 6/2014 | Sun | G06F 17/5081 716/106 |
| 8,775,993 | B2 | 7/2014 | Huang et al. | |
| 8,887,116 | B2 | 11/2014 | Ho et al. | |
| 9,009,632 | B2 * | 4/2015 | Dai | G06F 17/5081 716/112 |
| 2005/0138591 | A1 * | 6/2005 | Shirai | G06F 17/5081 716/111 |
| 2008/0115102 | A1 * | 5/2008 | Rittman | G06F 17/5068 716/52 |
| 2010/0205575 | A1 * | 8/2010 | Arora | G06F 17/5068 716/122 |
| 2011/0131543 | A1 * | 6/2011 | Majumder | G06F 3/0481 716/139 |
| 2012/0139582 | A1 * | 6/2012 | Cocchi | G06F 17/5068 326/41 |
| 2014/0101623 | A1 | 4/2014 | Chen et al. | |
| 2014/0201692 | A1 | 7/2014 | Chen et al. | |
| 2014/0237435 | A1 | 8/2014 | Chen et al. | |
| 2014/0282337 | A1 | 9/2014 | Yuh et al. | |
| 2014/0304670 | A1 | 10/2014 | Su et al. | |
| 2014/0310675 | A1 | 10/2014 | Liu et al. | |
| 2014/0325464 | A1 | 10/2014 | Hsu et al. | |

* cited by examiner

*Primary Examiner* — Nha Nguyen
(74) *Attorney, Agent, or Firm* — Hauptman Ham, LLP

(57) ABSTRACT

A system and method for tracing a net includes comparing an IC design against a marked portion of the IC design, and extracting a traced net that includes the marked portion from the IC design file. The method also includes displaying the traced net and storing at least one indicator along with information identifying the traced net.

20 Claims, 6 Drawing Sheets

```
GROUP CHECK_NET NETCHECK.? RES.HV.?
DRC SELECT CHECK CHECK_NET
ILP1i_new = ILP1u AND DIODUMMY
NETCHECK.1{
    test = DFM PROPERTY ILP1i_new    [X= F(NETID(ILP1i_new))]
    DFM PROPERTY ILP1u      test NODAL MULTI   [-= F(NETID(ILP1u))]      - PROPERTY(test,X) ] == 0
    DFM PROPERTY NTAPu      test NODAL MULTI   [-= F(NETID(NTAPu))]      - PROPERTY(test,X) ] == 0
    DFM PROPERTY NWELu      test NODAL MULTI   [-= F(NETID(NWELu))]      - PROPERTY(test,X) ] == 0
    DFM PROPERTY PTAPu      test NODAL MULTI   [-= F(NETID(PTAPu))]      - PROPERTY(test,X) ] == 0
    DFM PROPERTY PSDu       test NODAL MULTI   [-= F(NETID(PSDu))]       - PROPERTY(test,X) ] == 0
    DFM PROPERTY NSDu       test NODAL MULTI   [-= F(NETID(NSDu))]       - PROPERTY(test,X) ] == 0
    DFM PROPERTY M1u        test NODAL MULTI   [-= F(NETID(M1u))]        - PROPERTY(test,X) ] == 0
    DFM PROPERTY M2u        test NODAL MULTI   [-= F(NETID(M2u))]        - PROPERTY(test,X) ] == 0
    DFM PROPERTY M3u        test NODAL MULTI   [-= F(NETID(M3u))]        - PROPERTY(test,X) ] == 0
    DFM PROPERTY M4u        test NODAL MULTI   [-= F(NETID(M4u))]        - PROPERTY(test,X) ] == 0
    DFM PROPERTY MDu        test NODAL MULTI   [-= F(NETID(MDu))]        - PROPERTY(test,X) ] == 0
    DFM PROPERTY C0u        test NODAL MULTI   [-= F(NETID(C0u))]        - PROPERTY(test,X) ] == 0
    DFM PROPERTY VIA1uu     test NODAL MULTI   [-= F(NETID(VIA1uu))]     - PROPERTY(test,X) ] == 0
    DFM PROPERTY CTM_VIA1u  test NODAL MULTI   [-= F(NETID(CTM_VIA1u))]  - PROPERTY(test,X) ] == 0
    DFM PROPERTY VIA2uu     test NODAL MULTI   [-= F(NETID(VIA2uu))]     - PROPERTY(test,X) ] == 0
    DFM PROPERTY CTM_VIA2u  test NODAL MULTI   [-= F(NETID(CTM_VIA2u))]  - PROPERTY(test,X) ] == 0
    DFM PROPERTY VIA3uu     test NODAL MULTI   [-= F(NETID(VIA3uu))]     - PROPERTY(test,X) ] == 0
    DFM PROPERTY CTM_VIA3u  test NODAL MULTI   [-= F(NETID(CTM_VIA3u))]  - PROPERTY(test,X) ] == 0
    DFM PROPERTY VIADu      test NODAL MULTI   [-= F(NETID(VIADu))]      - PROPERTY(test,X) ] == 0
    DFM PROPERTY CTM3u      test NODAL MULTI   [-= F(NETID(CTM3u))]      - PROPERTY(test,X) ] == 0
    ................
}
```

Figure 3

SYSTEM AND METHOD FOR TRACING A NET

PRIORITY CLAIM

The present application claims the priority of China application no. 201410314963.9, filed Jul. 3, 2014, which is incorporated herein by reference in its entirety.

BACKGROUND

Electronic design automation (EDA) tools are used to create and verify integrated circuit (IC) designs, including routing of conductive paths ("nets") between nodes or terminals that collectively form circuits. Increasingly dense ICs cause increasingly difficult verification problems for EDA tools to overcome. Such EDA tools include design rule checker (DRC) tools to detect design rule violations according to specified IC parameters and layout versus schematic (LVS) tools to identify and check IC electrical connectivity against circuit schematics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a diagram of a computer instruction coding portion of a method of net tracing, in accordance with some embodiments.

DETAILED DESCRIPTION

Figure 1A:
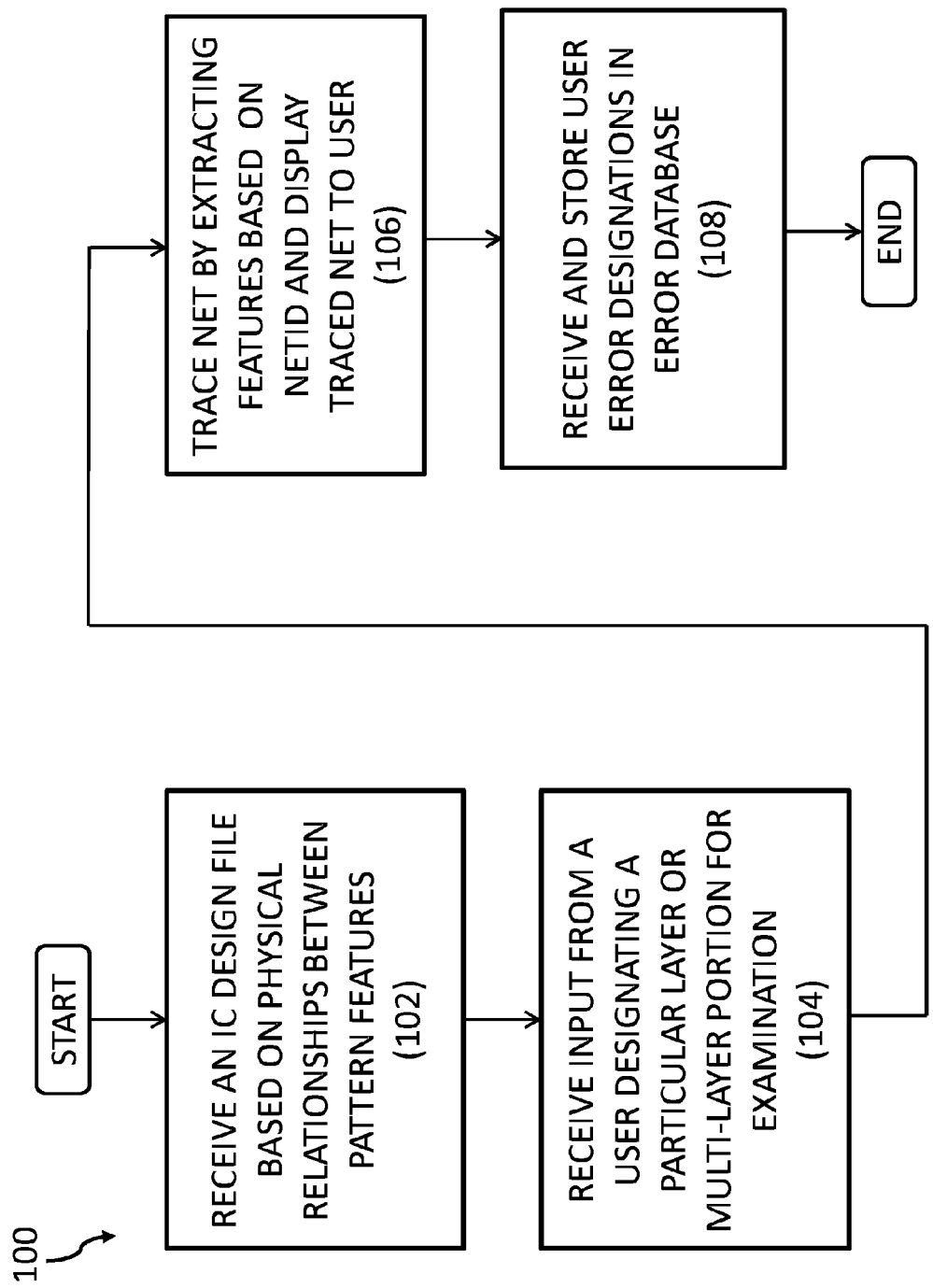
FIG. 1A is a flow chart of a method of net tracing, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Very large scale integration (VLSI) integrated circuits (ICs) typically contain a large number of nets. Each net is a separate electrically conductive pathway between nodes or terminals of devices that collectively forms electrical circuits. In some embodiments, a net is a separate electrically conductive portion of a metallization pattern on one photolithographic level of a VLSI IC. In some embodiments, a net includes portions of multiple metallization patterns on multiple photolithographic levels of a VLSI IC, with the portions on multiple levels electrically connected together by one or more vias passing between the multiple layers. Verifying nets in increasingly large, dense and highly interconnected VLSI ICs is a challenge to electronic design automation (EDA) tools. In particular, identifying (also referred to as tracing) the connections of a particular net, often through vias to multiple metal layers and devices, is often difficult and prone to occasional errors. For example, layout editing (LE) tools using simple Boolean logic models such as AND, OR, and NOT gates, occasionally fail to identify electro-static discharge (ESD)/latch-up prevention (LUP), and high voltage (HV) issues that arise in VLSI IC designs. A system and method for tracing a net is described in detail herein receives an indication from a user of a portion of a net, sets a corresponding marker, traces a net that includes the portion with the marker, identifies the traced net as a highlighted (or other method of indication) graphical representation to the user, and enables the user to selectively identify the traced net with an indicator, such as an indicator that indicates the traced net is erroneous. The traced net includes a description of the portions that make up the net, including the marked portion. For example, the traced net describes the conductive portions and connections made by one particular net in the IC design.

FIG. 1A is a flow chart of a method of net tracing 100, in accordance with some embodiments. The method 100 is performed by a programmed processor executing a set of instructions. In operation 102, an IC design file is received. The IC design file is based on physical relationships between portions of the IC including parameters such as relative position and physical dimensions. The IC design file contains information related to nets forming circuits of an IC design. In some embodiments, the IC design file is a mini-tech file used by some EDA tools.

The process flow proceeds to operation 104, in which input is received from a user selecting an identified portion of a net for tracing in the IC design (marked portion). The identified portion of a net is a particular layer portion or, in some embodiments, a particular multi-layer portion. In some embodiments, the multi-layer portion includes an inter-layer portion such as a via. In some embodiments, the input is received from a graphical user interface (GUI) enabling the user to move a cursor over a representation of the IC design and select a portion. In at least one embodiment, the input is received from a GUI enabling the user to move a cursor over a representation of the IC design and select a portion by a single click on a mouse or other input device. The input is used to set a marker on one of the patterns sufficient to identify the marked portion through its physical location on an IC design.

The process flow proceeds to operation 106, in which a net identified by the marker is traced throughout the pattern of conductive portions on one layer and through vias to one or more layers based on a net identification (NETID). Each portion of the IC design has a NETID identifying that portion. This process is described in more detail with respect to FIG. 1B. In at least some embodiments, the marker is traced through vias to all layers based on the NETID. In some embodiments, information about the traced net is displayed to the user by highlighting the traced net on a display. Highlighting the traced net on a display includes providing an additional visual indication of the traced net. In some embodiments, the additional visual indication changes the color, shading, patterning or size of the traced net. In some embodiments, information about the traced net is stored in a tangible medium. In some embodiments, the tangible medium is computer memory and, in other embodiments, the tangible medium is paper.

The process flow proceeds to operation 108, in which an error designation corresponding to an erroneous connectivity, as indicated by the user, is received and stored with information identifying the traced net. Erroneous connectivity is a variance between actual electrical connectivity in and IC design and specified electrical connectivity. For example, in some embodiments, the erroneous connectivity is an additional electrical connection to a node or terminal of a device not specified in a corresponding schematic. In some embodiments, the erroneous connectivity is a missing electrical connection to a node or terminal of a device specified in a corresponding schematic. In some embodiments, the error designation is received and stored in an error database and displayed on the display. In some embodiments, the error designation is stored in a tangible medium. In some embodiments, the tangible medium is computer memory and, in other embodiments, the tangible medium is paper.

Figure 1B:
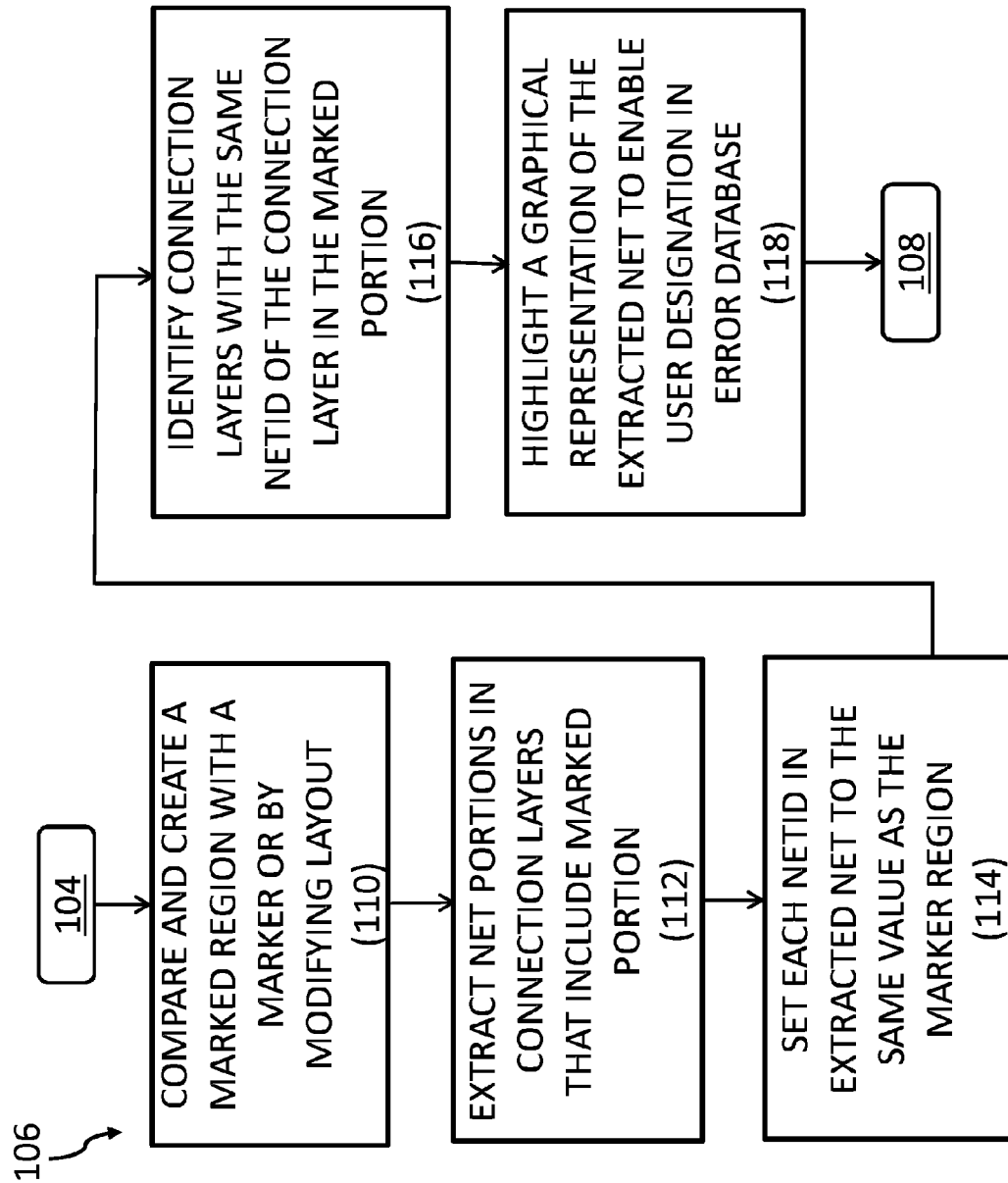
FIG. 1B is a flow chart of a portion of a method of net tracing, in accordance with some embodiments.

FIG. 1B is a flow chart of a portion of operation 106 (FIG. 1A) of the method of net tracing, in accordance with some embodiments. Following operation 104, the process flow proceeds to operation 110, in which a marker is assigned to one of the patterns used to create a marked region by comparing an IC design against a marked portion of the IC design, the marked portion of the IC design is designated by a user. In some embodiments, the marked region is created by modifying one or more of the layout parameters of the identified portion of the net. In some embodiments, a NETID identifying the marked portion is set to a revised value.

The process flow proceeds to operation 112 in which a traced net is extracted from circuit patterns on one or more connection layers that include the marked portion by progressively identifying adjacent electrically connected net portions of the patterns. In at least some embodiments, all adjacent electrically connected net portions of the patterns are identified. In some embodiments, the circuit patterns are metallization patterns formed by photolithographic techniques. Each identified adjacent electrically connected net portion has a NETID. In some embodiments, each NETID is unique.

In operation 114, each NETID of the electrically connected net portions of the patterns is overwritten and set to the same value as the NETID of the marked portion. For example, each net portion electrically connected to the marked portion is overwritten with the same NETID as the marked portion and portions electrically connected to those portions assigned the NETID of the marked portion are likewise assigned the NETID of the marked portion. The process of progressively assigning the same NETID to electrically connected portions continues until electrically connected portions are identified with the same NETID as the marked portion. In at least some embodiments, the process continues until all electrically connected portions are identified with the same NETID as the marked portion. In some embodiments, these electrically connection portions include one or more vias and electrically connected portions on other connection layers to fully identify (also referred to as extracting) each electrically connected portion of the traced net beginning with the marked portion. In some embodiments, operation 112 and operation 114 are iteratively performed to extract and identify the traced net.

The process flow proceeds to operation 116, in which each connection layer having the same NETID as the marked portion is identified. In some embodiments, identification of particular connection layers for the traced net in operation 116 facilitates highlighting of displayed layers in operation 118. In operation 118, the traced net is highlighted on a displayed IC design. Highlighting and describing the connections of the traced net enable the user to review the traced net, compare against a schematic, and if incorrect, enable the user to designate the traced net with an indicator. In some embodiments, the indicator indicates the traced net is erroneous. In at least some embodiments, indications of erroneous traced nets are stored in an error database. The error database enables review of traced nets identified by the user as being erroneous in order to ensure the errors are corrected and to identify systemic problems causing such errors.

Figure 2C:
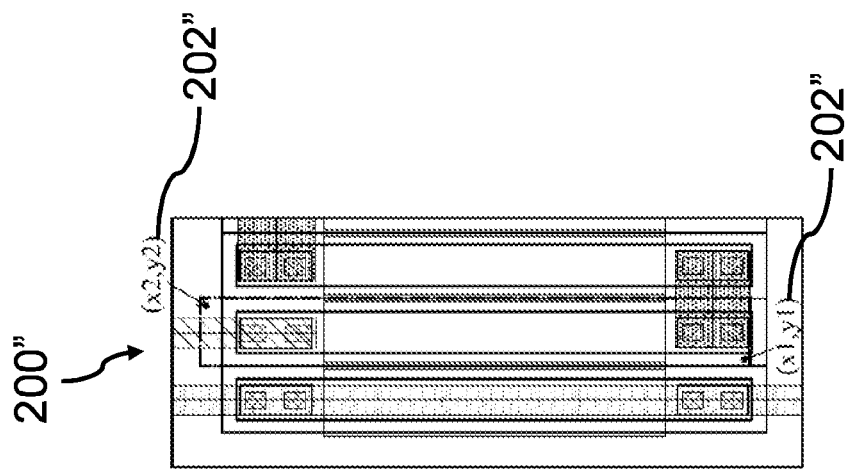
FIGS. 2A-2C are schematic diagrams of a marked portion of a method of net tracing, in accordance with some embodiments.
Figure 2B:
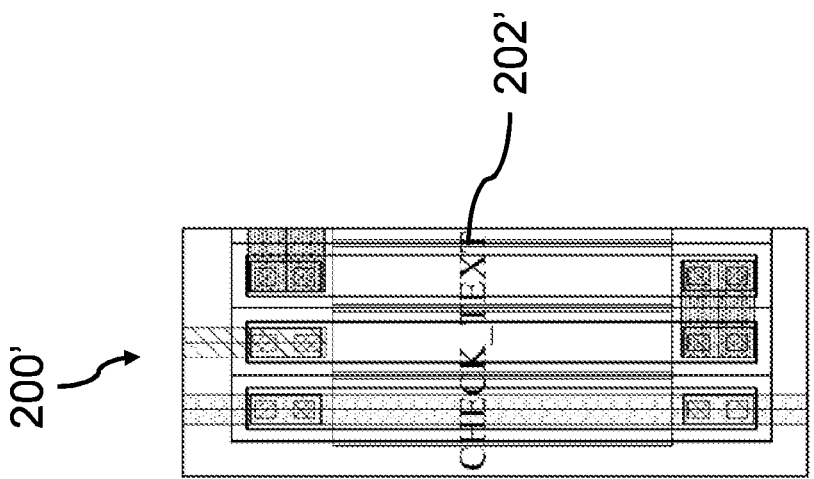
Figure 2A:
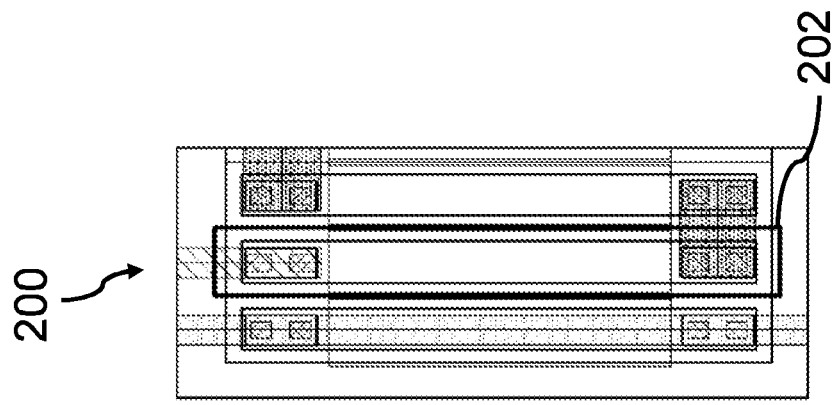

FIGS. 2A-2C are schematic diagrams of a marked portion 200 of a method of net tracing in accordance with some embodiments. In FIGS. 2A-2C, the same corresponding portion of IC design is illustrated with each figure illustrating analogous marked portions 200, 200', 200", each designated by a different marking method. In FIG. 2A, a marked layer portion 200 is designated by a drawn graphic shape 202, such as a rectangle, drawn around and containing within a conductive pattern designated as the marked portion. In some embodiments, the drawn graphic shape 202 takes the form of a triangle, square, rectangle, polygon, circle, ellipse, quadrilateral, parallelogram, or free-form drawing. The conductive pattern, such as a metal line running vertically, is the marked portion wherein a marker is set for the method of net tracing to use as a starting point.

In FIG. 2B, a marked portion 200' is designated by a text label placed over a conductive pattern designated as the marked portion. The text label is a series of alphanumeric characters received from a user to identify the marked portion 200'. In some embodiments, a single alphanumeric character is a text label. In some embodiments, the text label includes non-alphanumeric characters defined by the American standard code for information interchange (ASCII). A center of the text label or a corner is the specific point which anchors the text label to the marked portion 200' and precisely identifies the marked portion.

In FIG. 2C, a marked portion 200" is designated by graphic points 202" having X and Y axis components defining an area containing a conductive pattern designated as the marked portion. More specifically, a first graphic point 202" is indicated by (x1, y1) Cartesian coordinates and a second graphic point 202" is indicated by (x2,y2) Cartesian coordinates. In some embodiments, the graphic points 202" are cylindrical polar coordinates or spherical polar coordinates. The area defined by the graphic points 202" defines the marked portion. In some embodiments, a single graphic point 202" is used to define a marked portion and a single click is used to specify that single graphic point 202" in the marked portion. In some embodiments, more than two graphic points 202" are used to define a marked portion and each of two or more graphic points identify a corner of an area containing a conductive pattern designated as the marked portion.

FIG. 3 is a diagram of a computer instruction coding portion 300 of a method of net tracing in accordance with some embodiments. In a design rule checker (DRC) listing a number of design for manufacturing (DFM) pattern portions, each net has an unique NETID and a net comprises a number of connection layers such as ILP1$u$, NTAPu, NWELu, PTAPu, PSDu, NSDu, M1$u$, M2$u$, M3$u$, M4$u$, etc. As described herein, the coding portion 300 begins with a marked portion of an IC design having a particular NETID, identifies adjacent electrically connected portions, and rewrites the NETIDs of the electrically connected portions to be the same as the NETID of the marked portion.

Figure 4:
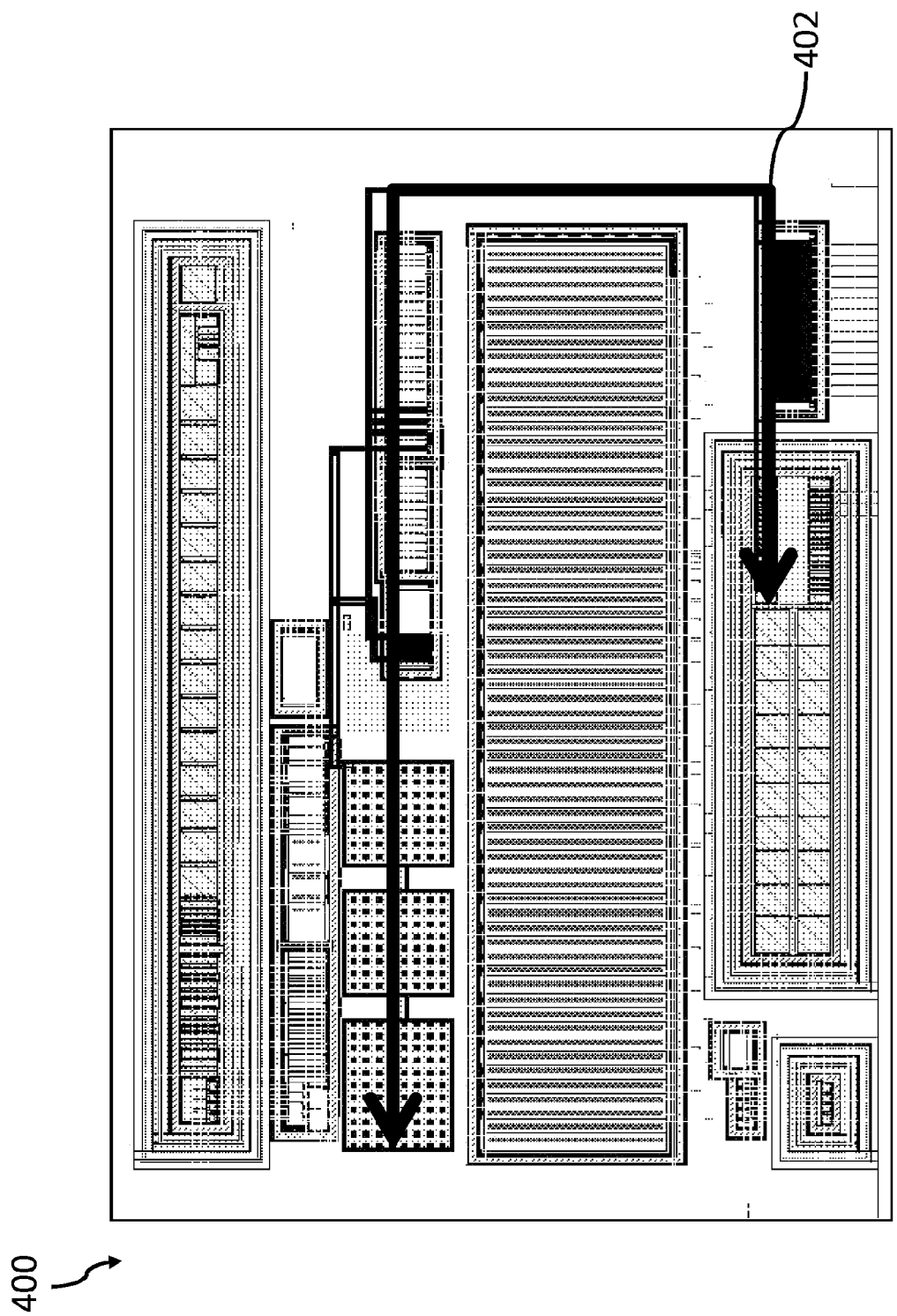
FIG. 4 is a schematic diagram of a highlighting portion of a method of net tracing, in accordance with some embodiments.

FIG. 4 is a schematic diagram of a highlighting portion 400 of a method of net tracing in accordance with some embodiments. A marker is set and a traced net, including the marked portion designated by a user, is extracted according to one of the methods described herein. The highlighting portion 400 includes a highlighted traced net 402. The highlighted traced net 402 includes arrowheads to indicate endpoints. In some embodiments, the arrowheads are not included. In some embodiments, the user reviews the highlighted traced net 402 and designates the traced net with an indicator. In some embodiments, the indicator indicates the traced net as being erroneous.

Figure 5:
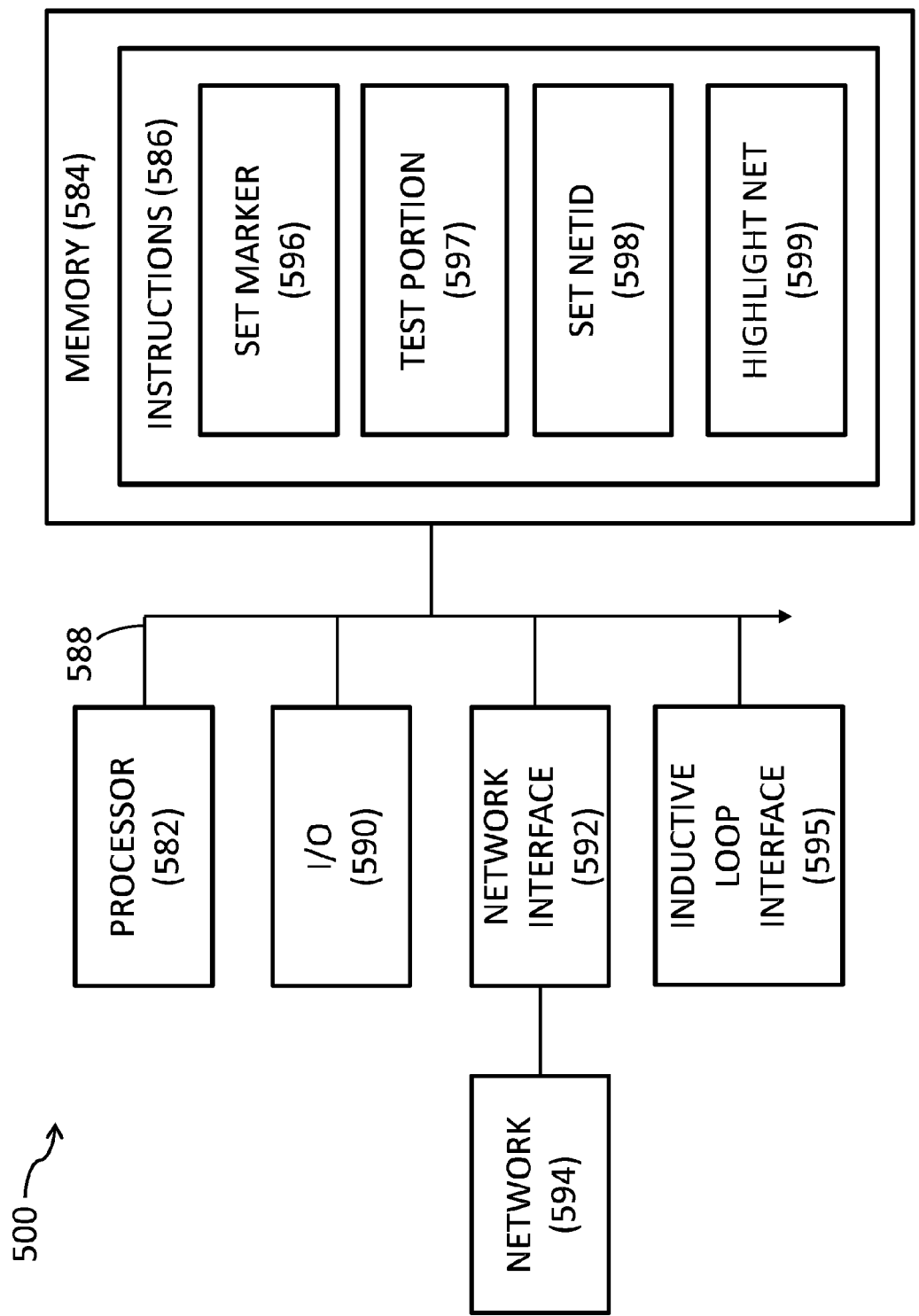
FIG. 5 is a block diagram of a computer system portion of a net tracing system, in accordance with some embodiments.

FIG. 5 is a block diagram of a computer system 500 portion of a net tracing system in accordance with some embodiments. In some embodiments, the computer system 500 executes a set of instructions to perform the method of net tracing 100 (FIGS. 1A and 1B). In other embodiments, the computer system 500 executes a set of instructions to perform displaying the schematics 200, 400 (FIGS. 2 and 4). In still other embodiments, the computer system 500 executes a set of instructions to perform coding portion of a method of net tracing (FIG. 3). Computer system 500 includes a hardware processor 582 and a non-transitory, computer readable storage medium 584 encoded with, i.e., storing, the computer program code 586, i.e., a set of executable instructions. The processor 582 is electrically coupled to the computer readable storage medium 584 via a bus 588. The processor 582 is also electrically coupled to an I/O interface 590 by bus 588. A network interface 592 is also electrically connected to the processor 582 via bus 588. Network interface 592 is connected to a network 594, so that processor 582 and computer readable storage medium 584 are capable of connecting and communicating to external elements via network 594. The processor 582 is configured to execute the computer program code 586 encoded in the computer readable storage medium 584 in order to cause computer system 500 to be usable for performing a portion or all of the operations as described with respect to the method of net tracing 100 (FIGS. 1A and 1B), displaying the schematics 200, 400 (FIGS. 2 and 4), and the coding portion of a method of net tracing (FIG. 3).

In some embodiments, the computer program code 586 includes an instruction 596 wherein the marked portion marker is set. A set marker instruction 596 sets the marker identifying which net is to be extracted and functions as a starting point for traced net extraction. A test portion instruction 597 queries whether an adjacent portion is electrically connected to the marked portion and, if so, a set NETID instruction 598 sets a NETID of the adjacent portion to the same value as the NETID of the marked portion. Instructions 596 and 597 proceed until the traced net is identified. A highlight net instruction 599 sets a display parameter of the traced net to highlight the traced net to a user.

In some embodiments, the processor 582 is a central processing unit (CPU), a multi-processor, a distributed processing system, an application specific integrated circuit (ASIC), and/or a suitable processing unit.

In some embodiments, the computer readable storage medium 584 is an electronic, magnetic, optical, electromagnetic, infrared, and/or a semiconductor system (or apparatus or device). For example, the computer readable storage medium 584 includes a semiconductor or solid-state memory, a magnetic tape, a removable computer diskette, a random access memory (RAM), a read-only memory (ROM), a rigid magnetic disk, and/or an optical disk. In some embodiments, using optical disks, the computer readable storage medium 584 includes a compact disk-read only memory (CD-ROM), a compact disk-read/write (CD-R/W), a digital video disc (DVD) and/or Blu-Ray Disk.

In some embodiments, the storage medium 584 stores the computer program code 586 configured to cause computer system 500 to perform the operations as described with respect to the method of net tracing 100 (FIGS. 1A and 1B), displaying the schematics 200, 400 (FIGS. 2 and 4), and the coding portion of a method of net tracing (FIG. 3).

In some embodiments, the storage medium 584 stores instructions 586 for interfacing with external components. The instructions 586 enable processor 582 to generate operating instructions readable by a system for performing the method of net tracing 100 (FIGS. 1A and 1B), displaying the schematics 200, 400 (FIGS. 2 and 4), and the coding portion of a method of net tracing (FIG. 3).

Computer system 500 includes I/O interface 590. I/O interface 590 is coupled to external circuitry. In some embodiments, I/O interface 590 includes a keyboard, keypad, mouse, trackball, trackpad, and/or cursor direction keys for communicating information and commands to processor 582.

Computer system 500 also includes network interface 592 coupled to the processor 582. Network interface 592 allows computer system 500 to communicate with network 594, to which one or more other computer systems are connected. Network interface 592 includes wireless network interfaces such as BLUETOOTH, WIFI, WIMAX, GPRS, or WCDMA; or wired network interface such as ETHERNET, USB, or IEEE-1394.

Computer system 500 also includes inductive loop interface 595 coupled to the processor 582. Inductive loop interface 595 allows computer system 500 to communicate with external devices, to which one or more other computer systems are connected. In some embodiments, the operations as described above are implemented in two or more computer systems 590.

Computer system 500 is configured to receive information related to the instructions 586 through I/O interface 590. The information is transferred to processor 582 via bus 588 to determine corresponding adjustments to the transportation operation. The instructions are then stored in computer readable medium 584 as instructions 586.

As described in detail herein, the system and method for net tracing receives an indication from a user of a portion of a net of interest (marked portion), sets a corresponding marker, extracts and traces a traced net that includes the marker, identifies the net as a highlighted graphical representation to the user, and enables the user to selectively identify the net as being erroneous. The system and method for net tracing enable accurate net tracing, automatic and GUI highlighting of a traced net, one click marked portion identification and net tracing, explicit connection debugging of ESD/LUP/Key Performance Indicators (KPIs) in a designer-oriented computer aided design (CAD) environment, cross-team reference for Process Design Kits (PDKs)/Research & Development (RD)/Product Engineer (PE), precise locations of erroneous net issues such as opens or shorts, faster chip-level net tracing and more realistic DRC/LVS traced net display.

Some embodiments include a method of tracing a net including comparing an IC design against a marked portion of the IC design and extracting a traced net that includes the marked portion from the IC design file. The method also includes displaying the traced net and storing at least one indicator along with information identifying the traced net.

Some embodiments include a method of tracing a net including comparing an IC design against a marked portion of the IC design, the marked portion of the IC design having a NETID. The method further includes identifying one or more conductive portions of the IC design electrically connected to the marked portion, the conductive portions each having a NETID different than the NETID of the marked portion. The method still further includes overwriting the NETID of the conductive portions with the NETID of the marked portion, the conductive portions and marked portion forming the traced net. The method further includes displaying the traced net and storing at least one indicator with information identifying the traced net.

Some embodiments include a net tracer including a computer-readable storage medium containing data representing an integrated circuit (IC) design, the IC design comprising a plurality of portions, and instructions for causing, if executed by a processor, the processor to perform a net tracer method. The net tracer further includes a processor coupled to read the storage medium, the processor configured for: comparing an IC design against a marked portion of the IC design, the marked portion of the IC design having a NETID. The processor further configured for identifying conductive portions of the IC design electrically connected to the marked portion, the conductive portions that are not in a same net with marked portion each having a NETID different than the NETID of the marked portion. The processor still further configured for overwriting the NETID of the conductive portions with the NETID of the marked portion, the conductive portions and marked portion forming the traced net. The processor further configured for displaying the traced net on a display with an additional visual indication identifying the traced net including at least one of changed color, shading, patterning or size of the traced net.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of tracing a net, comprising:
    comparing an IC design against a marked portion of the IC design;
    extracting a traced net that includes the marked portion from the IC design, wherein extracting the traced net comprises:
        identifying a net identification (NETID) of the marked portion, and
        overwriting a NETID of conductive portions of the traced net to match the NETID of the marked portion;
    displaying the traced net on a user interface, wherein displaying the traced net comprises displaying an identified variance, if any, between the IC design and the traced net; and
    storing at least one indicator along with information identifying the traced net.

2. The method of claim 1 wherein the marked portion of the IC design designated by a user is designated by a graphic shape being drawn around a conductive pattern designated as the marked portion.

3. The method of claim 1 wherein the marked portion of the IC design designated by a user is designated by a text label placed over a conductive pattern designated as the marked portion.

4. The method of claim 1 wherein the marked portion of the IC design designated by a user is designated by at least one graphic point having an X axis component and a Y axis component identifying an area containing a conductive pattern designated as the marked portion.

5. The method of claim 1 wherein the marked portion of the IC design designated by a user is designated by at least two graphic points each having an X axis component and a Y axis component identifying a corner of an area containing a conductive pattern designated as the marked portion.

6. The method of claim 1 wherein the IC design file is a mini-tech file.

7. The method of claim 1 wherein displaying the traced net includes an additional visual indication identifying the traced net including at least one of changed color, shading, patterning or size of the traced net.

8. The method of claim 1 wherein the at least one indicator indicates the traced net is erroneous.

9. A method of tracing a net, comprising:
    comparing an IC design against a marked portion of the IC design, the marked portion of the IC design having a net identification (NETID);
    identifying one or more conductive portions of the IC design electrically connected to the marked portion, each conductive portion of the conductive portions that are not in a same net with marked portion having a NETID different than the NETID of the marked portion;
    overwriting the NETID of the conductive portions with the NETID of the marked portion, the conductive portions and marked portion forming the traced net;
    displaying the traced net on a user interface, wherein displaying the traced net comprises displaying an identified variance, if any, between the IC design and the traced net; and
    storing at least one indicator with information identifying the traced net.

10. The method of claim 9 wherein, prior to overwriting, the NETID of the marked portion and each NETID of the conductive portions are unique in the IC design.

11. The method of claim 9 wherein one or more of the conductive portions are on multiple levels.

12. The method of claim 11 wherein the conductive portions on multiple levels are electrically connected through at least one via.

13. The method of claim 9 wherein the conductive portions are identified prior to overwriting each of the NETIDs of the conductive portions.

14. The method of claim 9 wherein each of the conductive portions are identified and the corresponding NETID of the identified conductive portions is overwritten with the NETID of the marked portion.

15. A system, comprising:
a computer-readable storage medium containing data representing an integrated circuit (IC) design, the IC design comprising a plurality of portions, and instructions for causing, if executed by a processor, the processor to perform a net tracer method; and
a processor coupled to read the storage medium, the processor configured for:
comparing an IC design against a marked portion of the IC design the marked portion of the IC design having a net identification (NETID);
identifying conductive portions of the IC design electrically connected to the marked portion, the conductive portions each having a net identification (NETID) different than the NETID of the marked portion;
overwriting the NETID of the conductive portions with the NETID of the marked portion, the conductive portions and marked portion forming the traced net;
displaying the traced net on a user interface with an additional visual indication identifying the traced net including at least one of changed color, shading, patterning or size of the traced net, wherein displaying the traced net comprises displaying an identified variance, if any, between the IC design and the traced net.

16. The system of claim 15 wherein, prior to overwriting, the NETID of the marked portion and each NETID of the conductive portions are unique in the IC design.

17. The system of claim 15 wherein at least one of the conductive portions is on multiple levels.

18. The system of claim 17 wherein the conductive portions on multiple levels are electrically connected through at least one via.

19. The system of claim 15 wherein the conductive portions are identified prior to overwriting each of the NETIDs of the conductive portions.

20. The system of claim 15 wherein each of the conductive portions are identified and the corresponding NETID of the identified conductive portions are overwritten with the NETID of the marked portion.

* * * * *